(12) United States Patent
Ahn et al.

(10) Patent No.: US 7,550,766 B2
(45) Date of Patent: Jun. 23, 2009

(54) THIN FILM TRANSISTOR (TFT) AND FLAT PANEL DISPLAY INCLUDING THE TFT

(75) Inventors: Taek Ahn, Suwon-si (KR); Min-Chul Suh, Suwon-si (KR); Jae-Bon Koo, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 343 days.

(21) Appl. No.: 11/403,011

(22) Filed: Apr. 13, 2006

(65) Prior Publication Data

US 2006/0237789 A1  Oct. 26, 2006

(30) Foreign Application Priority Data

Apr. 22, 2005  (KR) .................. 10-2005-0033532

(51) Int. Cl.
*H01L 31/00*  (2006.01)
(52) U.S. Cl. .......................... 257/59; 257/72
(58) Field of Classification Search .......... 257/40, 257/59, 72, 288
See application file for complete search history.

(56) References Cited

U.S. PATENT DOCUMENTS

| | | | | |
|---|---|---|---|---|
| 6,403,980 | B1* | 6/2002 | Park .............................. | 257/59 |
| 7,230,267 | B2* | 6/2007 | Nagayama et al. ............ | 257/40 |
| 2002/0022299 | A1 | 2/2002 | Jackson | |
| 2003/0201438 | A1 | 10/2003 | Park | |
| 2005/0019977 | A1 | 1/2005 | Prakash | |
| 2005/0029514 | A1 | 2/2005 | Moriya | |

FOREIGN PATENT DOCUMENTS

| | | |
|---|---|---|
| EP | 0 810 669 | 12/1997 |
| WO | WO 03/080285 | 10/2003 |
| WO | WO 2004/107473 | 12/2004 |

OTHER PUBLICATIONS

European Search Report of the European Patent Application No. 06 11 2894, issued on Aug. 21, 2006.

(Continued)

*Primary Examiner*—Jerome Jackson, Jr.
*Assistant Examiner*—Anthony Ho
(74) *Attorney, Agent, or Firm*—Robert E. Bushnell, Esq.

(57) ABSTRACT

A Thin Film Transistor (TFT) that can reduce leakage current and can prevent crosstalk between adjacent TFTs includes: a substrate; a gate electrode disposed on the substrate; a source electrode and a drain electrode separated from each other and insulated from the gate electrode; and a semiconductor layer which is insulated from the gate electrode, contacts each of the source and drain electrodes, and has grooves that separate at least a region of the semiconductor layer between the source and drain electrodes from the adjacent TFT. Each groove passes at least a portion of the semiconductor layer corresponding to the source and drain electrodes, and a projection image generated when each groove that passes at least a portion of the semiconductor layer corresponding to the source and drain electrodes is projected onto the source and drain electrodes covers the source and drain electrodes except for a portion of the source electrode that faces the drain electrode and a portion of the drain electrode that faces the source electrode.

20 Claims, 8 Drawing Sheets

OTHER PUBLICATIONS

An article "Patterning of poly(3-alkylthiophene) thin films by direct-write ultraviolet laser lithography" written by Wong et al., published in Materials Science and Engineering B, Elsevier Sequoia, Lausanna, CH, vol. 55, No. 1-2, pp. 71-78 on Aug. 14, 1998.

An article "Patterning pentacene organic thin film transistors" written by Kymissis, et al., published in Journal of Vacuum Science and Technology B, Microelectronics and Nanometer Structures Processing, Measurement and Phenomena, American Institute of Physics, NY, vol. 20, No. 3, pp. 956-959 on May 3, 2002.

European Search Report for European Patent Application No. 06112894.8-1528, issued on Dec. 20, 2006.

\* cited by examiner

THIN FILM TRANSISTOR (TFT) AND FLAT PANEL DISPLAY INCLUDING THE TFT

CLAIM OF PRIORITY

This application makes reference to, incorporates the same herein, and claims all benefits accruing under 35 U.S.C. §119 from an application for THIN FILM TRANSISTOR AND FLAT PANEL DISPLAY APPARATUS COMPRISING THE SAME earlier filed in the Korean Intellectual Property Office on 22 Apr. 2005 and there, duly assigned Ser. No. 10-2005-0033532.

BACKGROUND OF THE INVENTION

1. Field of the Invention

The present invention relates to a Thin Film Transistor (TFT) and a flat panel display including the TFT, and more particularly, to a TFT that reduces leakage current and prevents crosstalk between adjacent TFTs, and a flat panel display including the TFT.

2. Description of the Related Art

Thin Film Transistors (TFTs) used in liquid crystal displays, organic electroluminescent displays, or inorganic electroluminescent displays are used as switching devices to control the operation of each pixel or driving device for driving the pixel.

A TFT includes a source electrode and a drain electrode separated from each other, a semiconductor layer having a channel region formed between the source and drain electrodes, and a gate electrode insulated from the source electrode, the drain electrode, and the semiconductor layer.

When TFTs having the above structure are formed in an array, each of the TFTs operates as an independent switching device. The semiconductor layer can be patterned to prevent crosstalk between adjacent TFTs. For example, in the case of a conventional TFT, the semiconductor layer formed of silicon is patterned using a photolithgraphy method.

On the other hand, many attempts have been made to use a plastic substrate instead of a conventional glass substrate in a flexible display. The conventional silicon TFT can not be used since the plastic substrate can not be processed at a high temperature.

Therefore, methods of forming a TFT on a plastic substrate at a low temperature have been proposed. Particularly, many studies regarding a TFT that can be processed at a low temperature, that is, a TFT in which the semiconductor layer is formed of an organic material, have been undertaken. However, in the case of the organic TFT, the organic semiconductor layer cannot be patterned using the conventional photolithography method. That is, when the organic semiconductor layer is patterned using a conventional wet, dry, or mixed etching process, the organic semiconductor layer can be damaged, and thus, it cannot be used.

SUMMARY OF THE INVENTION

The present invention provides a Thin Film Transistor (TFT) that reduces leakage current and prevents crosstalk between neighboring TFTs, and a flat panel display including the TFT.

According to one aspect of the present invention, a Thin Film Transistor (TFT) is provided including: a substrate; a gate electrode arranged on the substrate; a source electrode and a drain electrode separated from each other and insulated from the gate electrode; and a semiconductor layer which is insulated from the gate electrode, contacts each of the source and drain electrodes, and includes grooves that separate at least a region of the semiconductor layer between the source and drain electrodes from an adjacent TFT; each groove passes at least a portion of the semiconductor layer corresponding to the source and drain electrodes, and a projection image generated upon each groove that passes at least a portion of the semiconductor layer corresponding to the source and drain electrodes being projected onto the source and drain electrodes covers the source and drain electrodes except for a portion of the source electrode that faces the drain electrode and a portion of the drain electrode that faces the source electrode.

A source wire is preferably electrically connected to the source electrode, each groove passes at least a portion of the semiconductor layer corresponding to the source wire, and a projection image generated upon each groove that passes a portion of the semiconductor layer corresponding to the source wire being projected onto the source wire covers the source wire.

A drain wire is preferably electrically connected to the drain electrode, each groove passes at least a portion of the semiconductor layer corresponding to the drain wire, and a projection image generated upon each groove that passes a portion of the semiconductor layer corresponding to the drain wire being projected onto the drain wire covers the drain wire.

Each groove preferably includes a closed curve. Each groove alternatively preferably includes at least a pair of parallel lines. A depth of each groove is preferably less than a thickness of the semiconductor layer. A depth of each groove is alternatively preferably greater than a thickness of the semiconductor layer, and is less than a thickness of at least a layer arranged under the semiconductor layer.

The TFT preferably further includes an insulating film adapted to insulate the semiconductor layer, the source electrode, and the drain electrode from the gate electrode.

The semiconductor layer preferably includes an organic semiconductor layer.

According to another aspect of the present invention, a Thin Film Transistor (TFT) is provided including: a substrate; a gate electrode arranged on the substrate and a gate wire electrically connected to the gate electrode; a source electrode and a drain electrode separated from each other and insulated from the gate electrode; and a semiconductor layer which is insulated from the gate electrode, contacts each of the source and drain electrodes, and has grooves that separate at least a region of the semiconductor layer between the source and drain electrodes from an adjacent TFT; each groove passes at least a portion of the semiconductor layer corresponding to the gate wire, and a width of a portion of each groove is greater than a width of the gate wire.

A projection image generated upon the groove that passes a portion of the semiconductor layer corresponding to the gate wire being projected onto the gate wire preferably covers the gate wire.

Each groove preferably includes a closed curve. Each groove alternatively preferably includes at least a pair of parallel lines. A depth of each groove is preferably less than a thickness of the semiconductor layer. A depth of each groove is alternatively preferably greater than a thickness of the semiconductor layer, and is less than a thickness of at least a layer arranged under the semiconductor layer.

The TFT preferably further includes an insulating film adapted to insulate the semiconductor layer, the source electrode, and the drain electrode from the gate electrode.

The semiconductor layer preferably includes an organic semiconductor layer.

According to still another aspect of the present invention, a Thin Film Transistor (TFT) is provided including: a substrate; a gate electrode arranged on the substrate; a source electrode and a drain electrode separated from each other and insulated from the gate electrode; and a semiconductor layer which is insulated from the gate electrode, contacts each of the source and drain electrodes, and has grooves that separate at least a region of the semiconductor layer between the source and drain electrodes from an adjacent TFT; a width of each groove is greater than a width of a wire arranged either on or under the semiconductor layer.

According to yet another aspect of the present invention, a flat panel display including a Thin Film Transistor (TFT) is provided including: a substrate; a gate electrode arranged on the substrate; a source electrode and a drain electrode separated from each other and insulated from the gate electrode; and a semiconductor layer which is insulated from the gate electrode, contacts each of the source and drain electrodes, and includes grooves that separate at least a region of the semiconductor layer between the source and drain electrodes from an adjacent TFT; each groove passes at least a portion of the semiconductor layer corresponding to the source and drain electrodes, and a projection image generated upon each groove that passes at least a portion of the semiconductor layer corresponding to the source and drain electrodes being projected onto the source and drain electrodes covers the source and drain electrodes except for a portion of the source electrode that faces the drain electrode and a portion of the drain electrode that faces the source electrode.

According to still another aspect of the present invention, a flat panel display including a TFT is provided including: a substrate; a gate electrode arranged on the substrate and a gate wire electrically connected to the gate electrode; a source electrode and a drain electrode separated from each other and insulated from the gate electrode; and a semiconductor layer which is insulated from the gate electrode, contacts each of the source and drain electrodes, and has grooves that separate at least a region of the semiconductor layer between the source and drain electrodes from an adjacent TFT; each groove passes at least a portion of the semiconductor layer corresponding to the gate wire, and a width of a portion of each groove is greater than a width of the gate wire.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

The present invention is described more fully below with reference to the accompanying drawings in which exemplary embodiments of the invention are shown.

Figure 1:
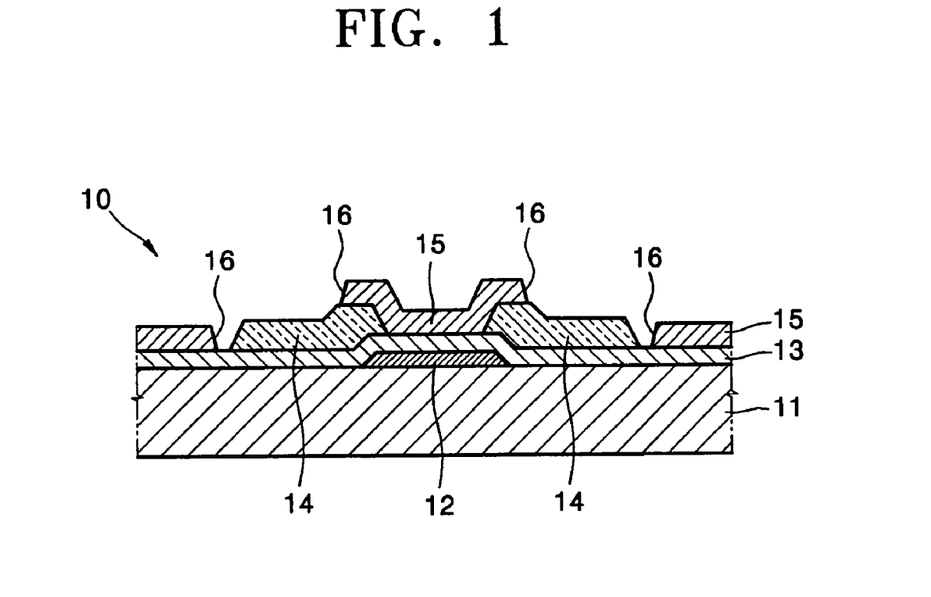
FIG. 1 is a cross-sectional view of a Thin Film Transistor (TFT) according to an embodiment of the present invention.
Figure 2:
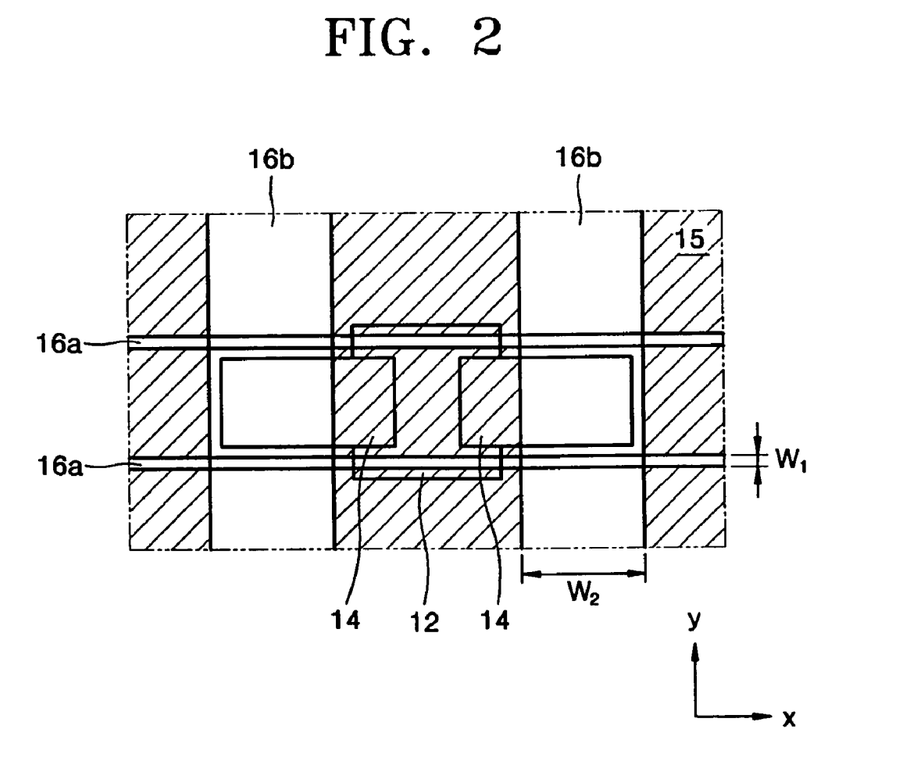
FIG. 2 is a plan view of the TFT of FIG. 1.

FIG. 1 is a cross-sectional view of a Thin Film Transistor (TFT) according to an embodiment of the present invention, and FIG. 2 is a plan view of the TFT of FIG. 1.

Referring to FIGS. 1 and 2, a TFT is formed on a substrate 11. The substrate 11 can be formed of various materials, such as glass, metal, or plastic.

A gate electrode 12 and source and drain electrodes 14, which are separated from each other and insulated from the gate electrode 12, are formed on the substrate 11. Also, a semiconductor layer 15 which is insulated from the gate electrode 12, contacts each of the source and drain electrodes 14, and includes a groove 16 formed on the substrate to separate at least a region between the source and drain electrodes 14 from an adjacent TFT. For convenience of explanation, grooves 16a in the x direction and grooves 16b in the y direction in FIG. 2 are separately depicted and the shape of each groove is constant even at crossing regions. An insulating film 13 for insulating the source and drain electrodes 14 and the semiconductor layer 15 from the gate electrode 12 can also be included therebetween.

The semiconductor layer 15 can be formed of various inorganic or organic semiconductor materials.

The semiconductor layer 15 can be formed of an inorganic semiconductor material including CdS, GaS, ZnS, CdSe, CaSe, ZnSe, CdTe, SiC, or Si. The semiconductor layer 15 can be formed of an organic semiconductor material including a polymer organic material or a low molecular weight organic material. The polymer organic material can include polythiophene and its derivatives, polyparaphenylenevinylene and its derivatives, polyparaphenylene and its derivatives, polyplorene and its derivatives, polythiopenevinylene and its derivatives, polythiophene-hetero ring aromatic copolymer and its derivatives, and the low molecular weight organic material can include pentacene, tetracene, alpha-6-thiophene, alpha-5-thiophene oligothiophene and its derivatives, phthalocianin that does not include a metal and its derivatives, phyromelitic dianhydride or phyromelitic diimid and its derivatives, perrylenetetracarboxy acid dianhydride or perrylenetetracarboxylic diimid and its derivatives. The semiconductor layer 15 of an organic semiconductor material can be formed using various methods including deeping or spin coating.

In the structure described above, a channel is formed in the semiconductor layer 15 in response to signals supplied to the gate electrode 12, and an electrical signal is transmitted between the source and drain electrodes 14 through the channel. Crosstalk can be caused between adjacent TFTs. Accordingly, a method of preventing crosstalk is required, and for this purpose, the groove 16 is formed in the semiconductor layer 15. The groove 16 causes at least a patterning effect in that the channel is separated from the adjacent TFT when the channel is formed in the semiconductor layer 15 by supplying a signal to the gate electrode 12. In FIGS. 1 and 2, the grooves 16 are denoted by two parallel straight lines respectively extending in the x direction and y direction so that the channel can be separated from the adjacent TFTs.

To form the grooves 16 in the semiconductor layer 15, various methods can be used. The grooves 16 can be formed using a Laser Ablation Technique (LAT) to remove a portion of the semiconductor layer 15 by irradiating a laser beam onto the semiconductor layer 15.

As depicted in FIG. 2, a semiconductor layer of an island shape can be formed between the source and drain electrodes 14 by forming the grooves 16a as two parallel straight lines by irradiating a laser beam onto the semiconductor layer 15 by moving the laser or the substrate 11 in the x direction, and again by forming the grooves 16b as two parallel straight lines by irradiating the laser beam onto the semiconductor layer 15 by moving the laser or the substrate 11 in the y direction. Of course, the grooves 16a and 16b can be formed using other various methods.

In the abode structure, the grooves 16 are formed corresponding to regions of the source and drain electrodes except for a portion of the source electrode, which faces the drain electrode, and a portion of the drain electrode, which faces the source electrode. That is, the width of the groove 16 formed in a portion of the semiconductor layer 15 corresponding to the source and drain electrodes 14 is equal to or greater than the width of the source and drain electrodes 14. A method of forming the grooves 16 having a width greater than the width of the source and drain electrodes 14 is described below in detail.

Figure 3:
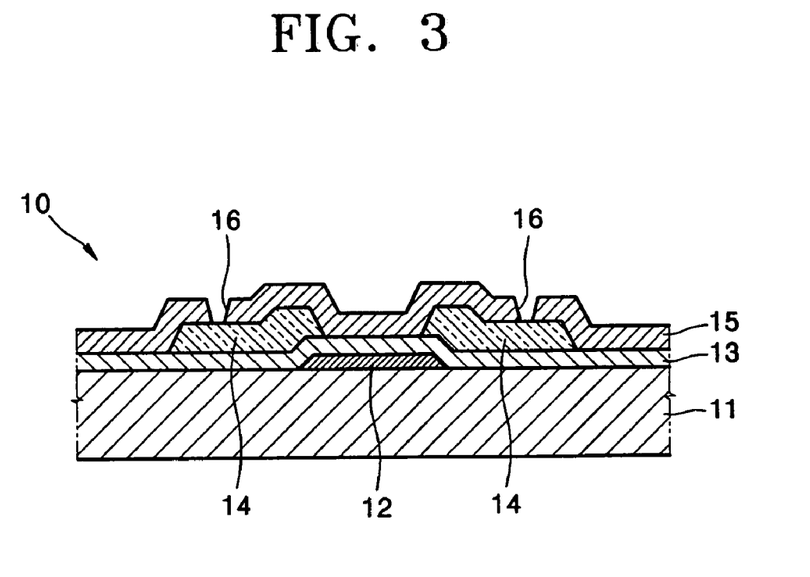
FIG. 3 is a cross-sectional view of a TFT as a comparative example to the TFT of FIG. 1.
Figure 4:
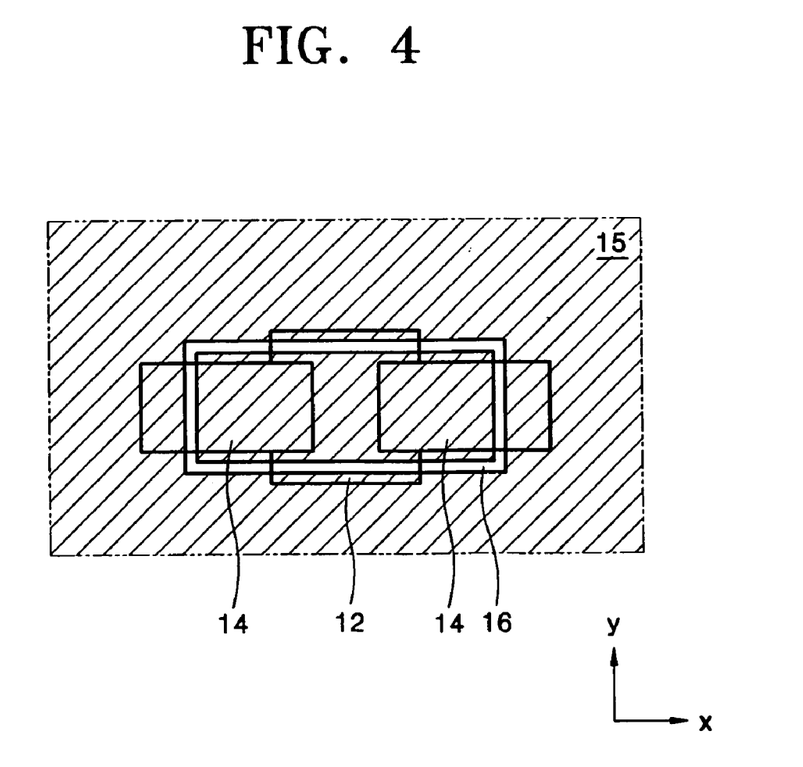
FIG. 4 is a plan view of the TFT of FIG. 3.

FIG. 3 is a cross-sectional view of a TFT as a comparative example to the TFT of FIG. 1, and FIG. 4 is a plan view of the TFT of FIG. 3.

The TFT FIG. 3 has a similar configuration to the TFT of FIG. 1, except that the shape of the groove 16 formed in the semiconductor layer 15 is different from that in the TFT of FIG. 1. That is, in the case of the TFT of FIG. 3, the grooves 16 separate only a region of the semiconductor layer 15 between the source and drain electrodes 14 from other regions of the semiconductor layer 15. In FIG. 4, the groove 16 is depicted as a closed curve, but, of course, the groove 16 can include two parallel grooves extending in the x direction and two parallel grooves extending in the y direction. However, referring to the TFT of FIGS. 1 and 2, the grooves 16 are arranged so that the semiconductor layer 15 cannot be formed on a region corresponding to the source and drain electrodes 14.

That is, in the case of the TFT according to the present embodiment depicted in FIGS. 1 and 2, the grooves 16 formed in the semiconductor layer 15 pass at least a portion of the semiconductor layer 15 corresponding to the source and drain electrodes 14. A projection image generated when the grooves 16 that pass the portion of the semiconductor layer 15 corresponding to the source and drain electrodes 14 are projected onto the source and drain electrodes 14, covers the source electrode 14 except for a portion of the source electrode that faces the drain electrode and a portion of the drain electrode that faces the source electrode. That is, the semiconductor layer 15 is not formed on the source and drain electrodes 14 except for the portion of the source electrode that faces the drain electrode and the portion of the drain electrode that faces the source electrode.

As described above, to prevent crosstalk between adjacent TFTs, the groove 16 is formed in the semiconductor layer 15, that is, a patterning effect by the groove can be attained. Referring to FIGS. 3 and 4, the semiconductor layer 15 still remains on the source and drain electrodes 14. When a channel is formed on the semiconductor layer 15 by supplying a signal to the gate electrode 12, and thus an electrical signal is transmitted between the source and drain electrodes 14, the channel can be formed only between the source and drain electrodes. Accordingly, the semiconductor layer 15 does not need to exist on the source and drain electrodes 14 except for the portion of the source electrode that faces the drain electrode and the portion of the drain electrode that faces the source electrode. If the semiconductor layer 15 remains on the remaining portions of the source and drain electrodes 14, a current leakage can occur, thereby deteriorating the characteristics of the TFT. Therefore, the current leakage can be prevented by the grooves 16 that pass the region of the semiconductor layer 15 corresponding to the source and drain electrodes 14, and the characteristics of the TFT can be improved by increasing the width of the grooves 16 that pass the portions of the semiconductor layer 15 corresponding to the source and drain electrodes 14. In this case, as depicted in FIG. 2, the width of the groove 16 can vary; for example, the width W1 of the groove 16a in the x direction can be different from the width W2 of the groove 16b in the y direction.

The formation of the groove 16 on the semiconductor layer 15 using a laser ablation technique is particularly effective when the semiconductor layer 15 is formed of an organic material, that is, when an organic TFT is formed. As described above, in the case of the organic semiconductor layer, since the organic material can be damaged after the organic semiconductor layer has been formed, a patterning method using a wet etching process such as photolithography, can not be applied. However, as described above, the semiconductor layer region that connects the source and drain electrodes 14 is separated from an adjacent TFT by the groove 16, that is, a patterning effect which prevents crosstalk can be attained.

In FIG. 2, the grooves 16a are parallel to each other in the x direction and the grooves 16b are parallel to each other in the y direction, but the present invention is not limited thereto. That is, as depicted in FIG. 4, the grooves 16 can be formed as a closed curve, and the width of a portion of the groove 16 corresponding to the source and drain electrodes 14 can be formed to correspond to the source and drain electrodes 14 except for the portion of the source electrode that faces the drain electrode and the portion of the drain electrode that faces the source electrode. Also, the groove can be formed in various shapes.

Figure 5:
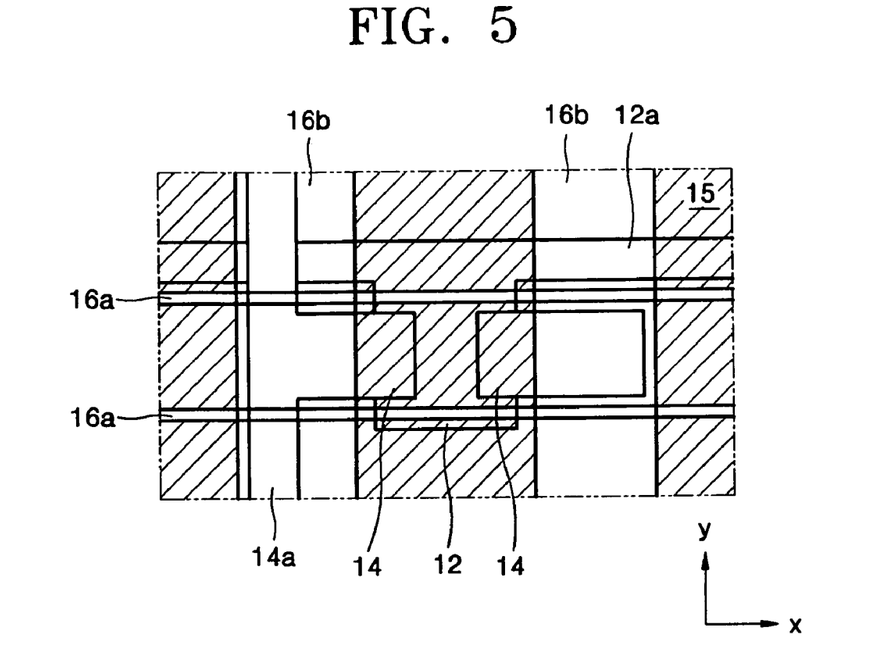
FIGS. 5 through 7 are plan views of TFTs according to another embodiment of the present invention.
Figure 6:
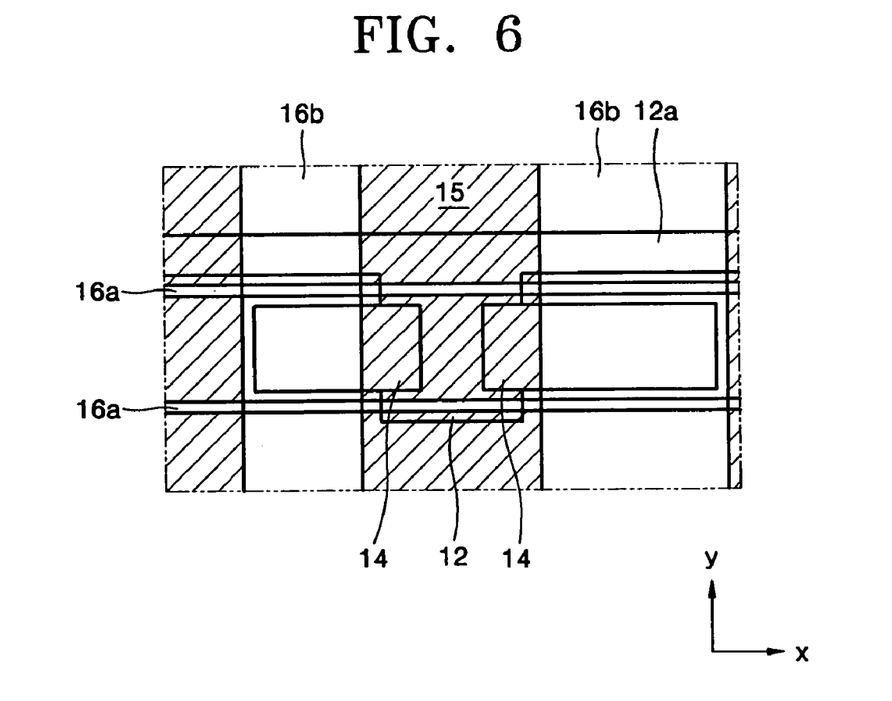
Figure 7:
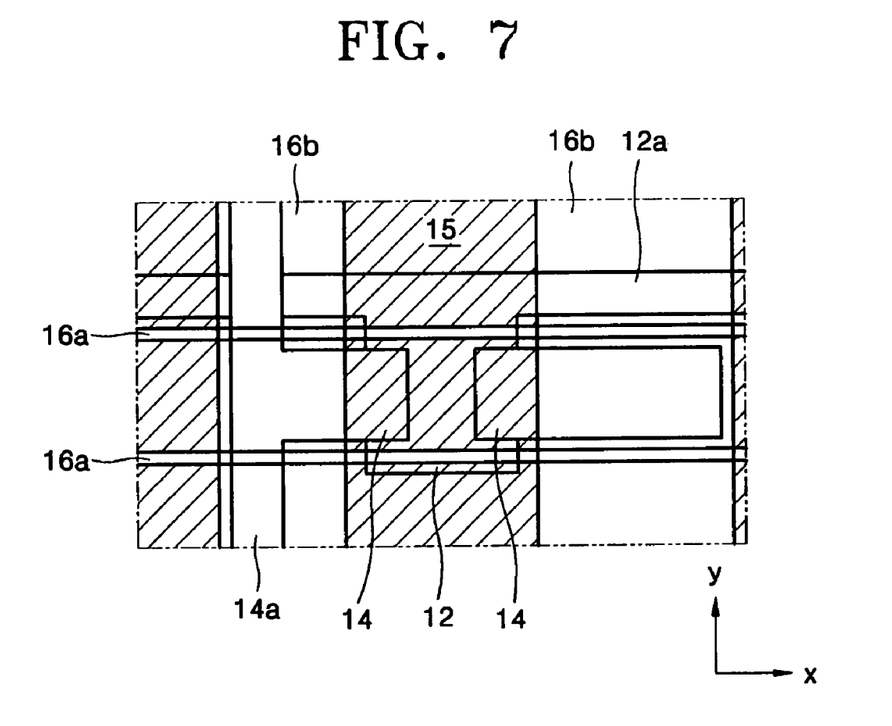

FIGS. 5 through 7 are plan views of TFTs according to another embodiment of the present invention.

In FIGS. 1 and 2, the width of the groove formed in the semiconductor layer corresponding to the source and drain electrodes is equal to or greater than the width of the semiconductor layer. As depicted in FIG. 5 and 6, a source wire or a drain wire 14a can be connected to one of the source and drain electrodes 14, or as depicted in FIG. 7, the wire 14a can be connected to both source and drain electrodes 14. In this case, the leakage current at a portion of the semiconductor layer 15 can be prevented by forming the groove 16 in the portion of the semiconductor layer 15 corresponding to the wire 14a and the width of the groove 16 greater than the width of the wire 14a. The wire can be an electrically conductive element connected to the source or drain electrode 14. For example, the wire can include an electrode of a capacitor that is connected to the source or drain electrode 14.

Figure 8:
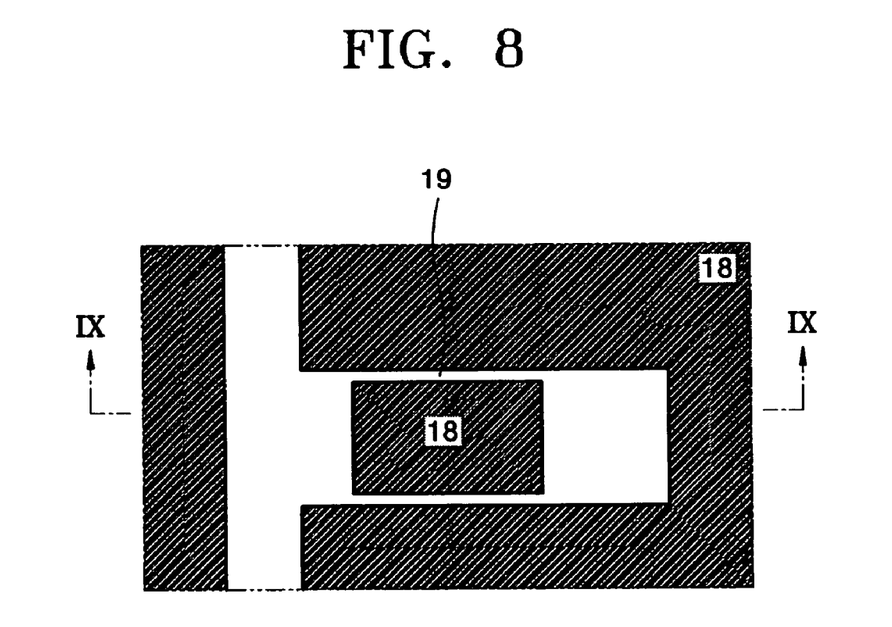
FIG. 8 is a plan view of a photomask used for manufacturing a TFT according to still another embodiment of the present invention.
Figure 9:
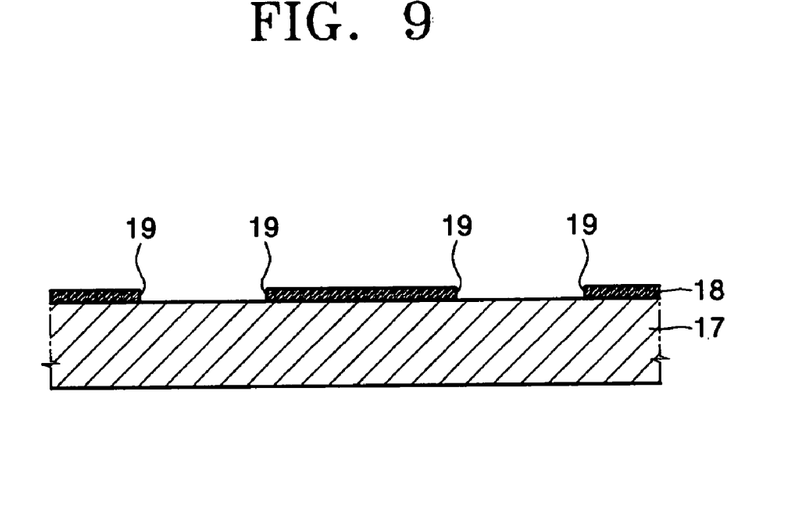
FIG. 9 is a cross-sectional view taken along line IX-IX of FIG. 8.
Figure 10:
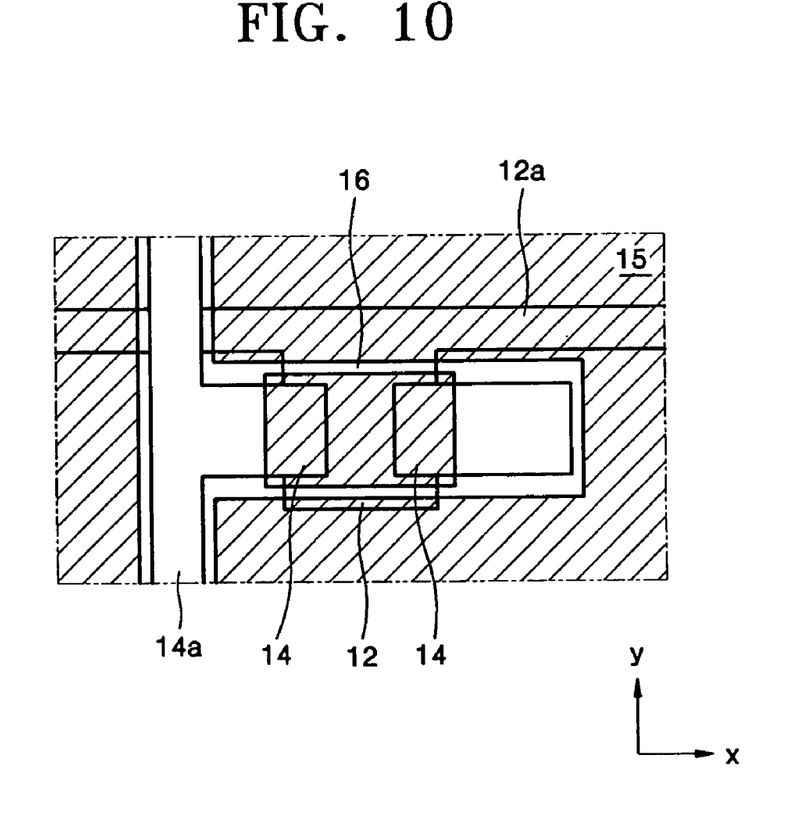
FIG. 10 is a plan view of a TFT manufactured using the photomask of FIG. 8.

FIG. 8 is a plan view of a photomask used for manufacturing a TFT according to still another embodiment of the present invention, FIG. 9 is a cross-sectional view taken along line IX-IX of FIG. 8, and FIG. 10 is a plan view of a TFT manufactured using the photomask of FIG. 8, according to still another embodiment of the present invention.

As described above, when the groove 16 depicted in FIG. 5 is formed using the laser ablation technique, an island shaped semiconductor layer 15 can be formed between the source and drain electrodes 14 by forming the grooves 16a as two parallel straight lines by irradiating a laser beam onto the semiconductor layer 15 by moving the laser or the substrate 11 in the x direction, and again by forming the grooves 16b as two parallel straight lines by irradiating the laser beam onto the semiconductor layer 15 by moving the laser or the substrate 11 in the y direction. However, in this case, the semiconductor layer 15 at the crossing region of the x direction grooves 16a and the y direction grooves 16b can result in double scanning, and accordingly, layers under the crossing region of the semiconductor layer 15 can be damaged.

Therefore, when the grooves are formed in the semiconductor layer 15 by irradiating the laser beam, a mask can be used. In this case, the laser beam is controlled so that a region where the groove will be formed can be scanned only once. In this way, the multiple scanning of the laser beam onto the specific region of the semiconductor layer 15, where the groove will be formed, can be avoided, thereby preventing the damage of layers thereunder.

When the grooves are formed, a photomask can be used. A plan view of the photomask is depicted in FIG. 8, and a cross-sectional view taken along line IX-IX of the photomask of FIG. 8 is depicted in FIG. 9. Referring to FIGS. 8 and 9, a light shielding unit 18 formed of a material, such as Ni, Cr, or Co, is formed on a substrate 17 through which a laser beam can pass, such as a glass substrate. The light shielding unit 18 includes an opening 19 having a predetermined pattern corresponding to the shape of the grooves of the semiconductor layer 15. FIG. 10 is a plan view of a TFT having grooves formed by irradiating a laser onto a semiconductor layer using the photomask depicted in FIG. 8.

When the groove 16 depicted in FIG. 10 is formed using the photomask depicted in FIGS. 8 and 9, the laser beam can be controlled so that the region where the groove 16 is formed can be radiated only once by irradiating the laser beam having a sufficiently large width in the x direction while the laser or the substrate moves in the y direction.

Figure 11:
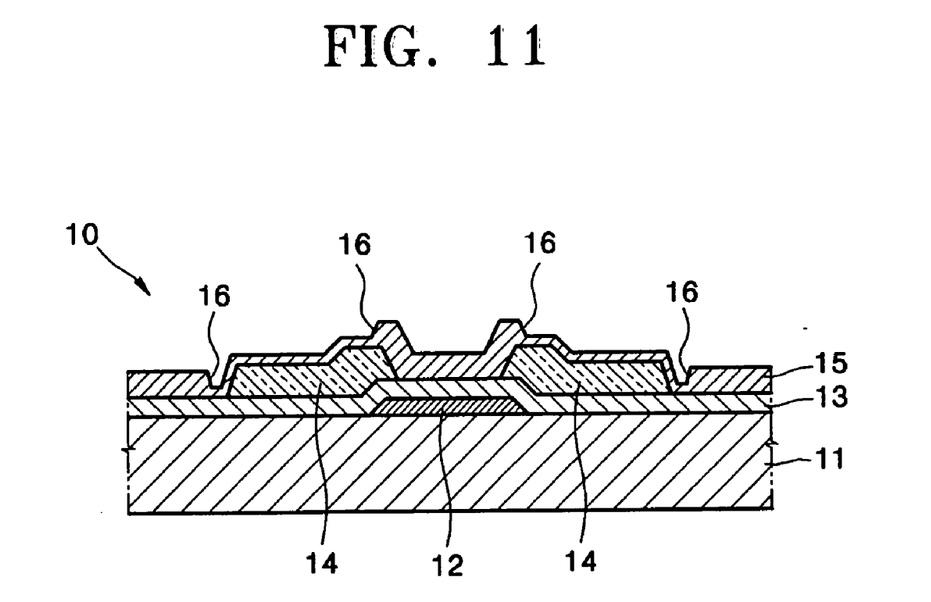
FIG. 11 is a cross-sectional view of a TFT according to yet another embodiment of the present invention.
Figure 12:
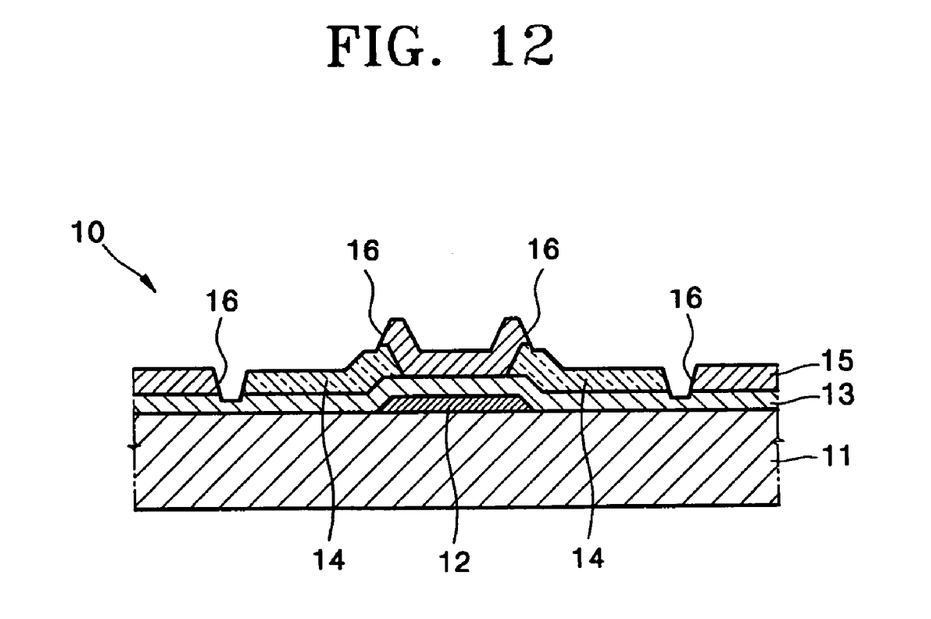
FIG. 12 is a cross-sectional view of a TFT according to still another embodiment of the present invention.

On the other hand, in the TFT in FIG. 1, the depth of the grooves 16 is identical to the thickness of the semiconductor layer 15. However, the present invention is not limited thereto. That is, in a TFT according to yet another embodiment of the present invention as depicted in FIG. 11, the depth of the grooves 16 can be smaller than the thickness of the semiconductor layer 15. Or, as in a TFT according to still another embodiment of the present invention as depicted in FIG. 12, the depth of the grooves 16 can be greater than the thickness of the semiconductor layer 15. In other words, the depth of the grooves 16 can be smaller or greater than the thickness of the semiconductor layer 15 provided that the grooves 16 are formed in the semiconductor layer 15. The depth of the grooves 16 can be controlled by controlling the intensity of the laser irradiated onto the semiconductor layer 15.

Figure 13:
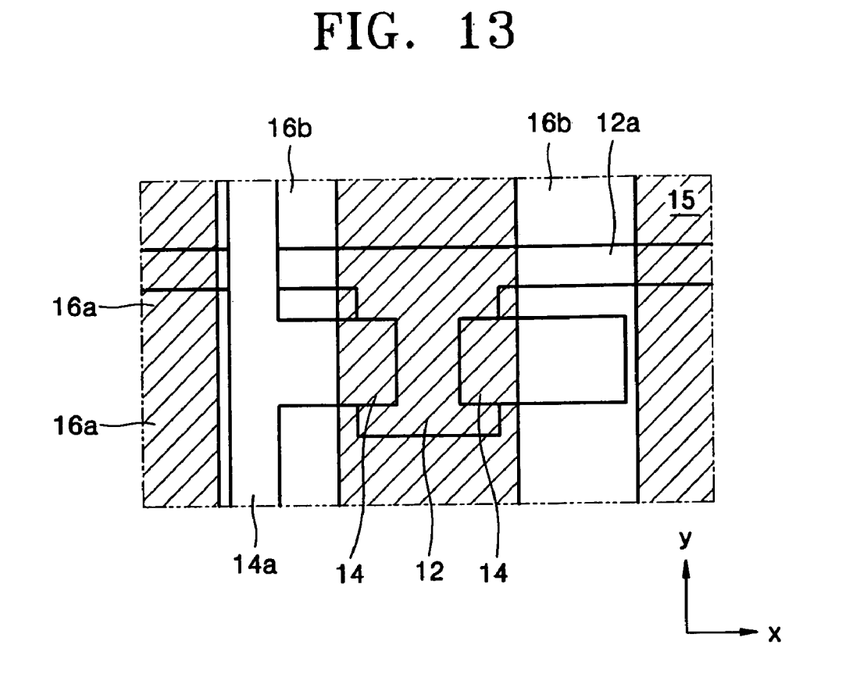
FIG. 13 is a plan view of a TFT according to another further embodiment of the present invention.

Also, the grooves 16 do not need to be formed in a closed curve, or to surround the semiconductor layer 15 corresponding to the region between the source and drain electrodes 14 as depicted in FIGS. 2, 5 through 7, and 10, and can be formed in various forms. That is, if no TFT is formed on an adjacent side, the groove 16 need not be formed on the adjacent side, or even if a TFT is formed on an adjacent side, the groove 16 need not be formed in the adjacent side according to a particular requirement. For example, as in a TFT according to another embodiment of the present invention depicted in FIG. 13, the groove 16 can be formed in a shape of a pair of parallel lines.

Figure 14:
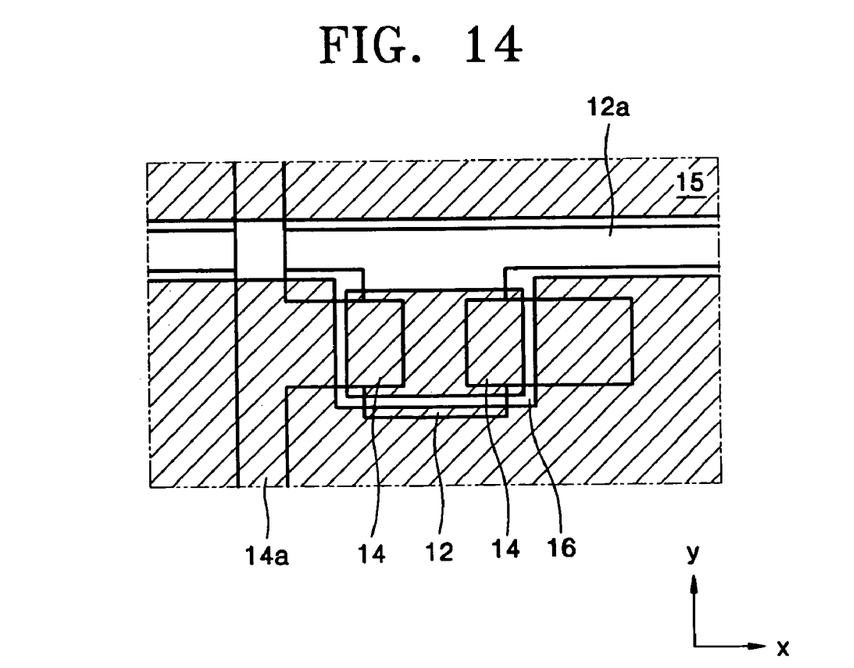
FIG. 14 is a plan view of a TFT according to another embodiment of the present invention.

FIG. 14 is a plan view of a TFT according to yet another embodiment of the present invention.

As described above, a channel is formed in the semiconductor layer 15 as a signal is supplied to a gate electrode 12, and an electrical signal is transmitted between source and drain electrodes 14 through the channel. It is desirable for the channel to be formed only between the source and drain electrodes 14. However, the channel can be substantially formed in the region It of the semiconductor layer 15 corresponding to the gate electrode 12. To supply a signal to the gate electrode 12, a gate wire 12a is electrically connected to the gate electrode 12. Accordingly, the channel can be formed in a region of the semiconductor layer 15 corresponding to the gate wire 12a. As a result, a leakage current can be generated along the gate wire 12a or crosstalk can occur between adjacent TFTs.

Accordingly, the grooves 16 are formed in the semiconductor layer 15 to pass at least a portion of the semiconductor layer 15 corresponding to the gate wire 12a, and the width of the grooves 16 in the portion of the semiconductor layer 15 can be greater than the width of the gate wire 12a. More specifically, the grooves 16 can be formed so that when the grooves 16 that pass the portion of the semiconductor layer 15 corresponding to the gate wire 12a are projected onto the gate wire 12a, the projection image can cover the gate wire 12a. By forming the grooves 16 having the above shape, leakage current along the gate wire 12a and crosstalk between adjacent TFTs can be prevented.

Figure 15:
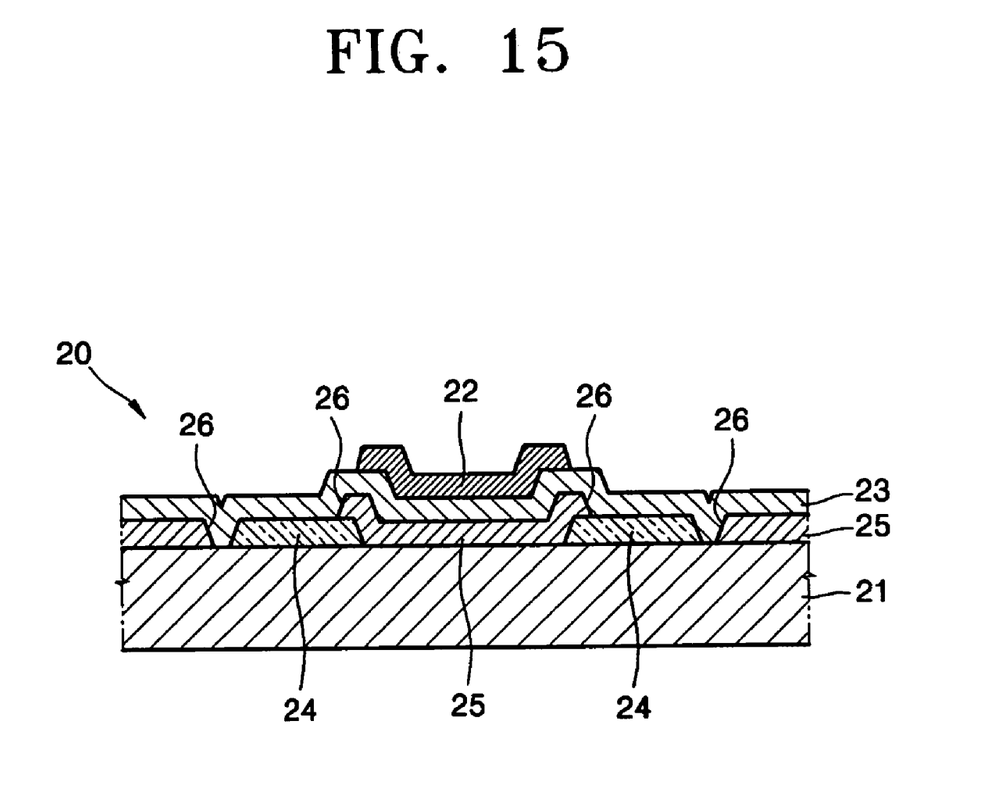
FIG. 15 is a cross-sectional view of a TFT according to another embodiment of the present invention.

Although the above embodiments of the present invention have described based on a so called 'inverted coplanar type TFT' in which a gate electrode is disposed on a substrate, an insulating film covering the gate electrode is disposed, source and drain electrodes are disposed on the insulating film, and a semiconductor layer covering the source and drain electrodes are formed, the present invention is not limited thereto. That is, the present invention can be applied to various types of TFTs, such as a stagger type TFT according to another embodiment of the present invention depicted in FIG. 15.

Also, in the TFTs according to the above embodiments of the present invention, the TFTs include a semiconductor layer which contacts source and drain electrodes of the TFTs and includes a groove to separate at least a region between the source and drain electrodes from adjacent TFTs, wherein the width of the grooves is greater than the width of a wire disposed on or under the semiconductor layer.

The TFTs described above, particularly, the organic TFTs, can be used for a flexible flat panel display having a TFT due to its good flexibility. The flat panel display includes liquid crystal displays or organic electroluminescent displays.

That is, the TFT described above can be used as a switching transistor or a driving transistor for a flat panel display, or a transistor for various drivers.

When the TFT is used as a driving transistor, a pixel electrode of a display element can be connected to one of the source and drain electrodes.

The TFT according to the present invention is particularly useful for organic electroluminescent displays. Therefore, an organic electroluminescent display having a TFT according to the present invention is described briefly as follows.

An electroluminescent display has various pixel patterns according to color of light of the electroluminescent device, and it can include red, green, and blue sub-pixels. Each of the red, green, and blue sub-pixels has an electroluminescent element, which is an emissive element.

Various types of electroluminescent display devices can be used, but, in the present invention, an electroluminescent display is an Active Matrix (AM) electroluminescent display having the TFT described above.

The electroluminescent display displays an image by emitting red, green, or blue light in response a current flow, and the electroluminescent element includes a pixel electrode connected to one of the source and drain electrodes of the TFT described above, a facing electrode disposed to cover the entire pixels, and an intermediate layer that includes at least a light emitting layer disposed between the pixel electrode and the facing electrode. However, the present invention is not limited thereto, and various electroluminescent elements can be used.

The pixel electrode functions as an anode electrode and the facing electrode functions as a cathode electrode, but the polarity of the pixel electrode and the facing electrode can be reversed.

The pixel electrode can be formed as a transparent electrode or a reflection electrode. When the pixel electrode is formed as a transparent electrode, the pixel electrode can be formed of ITO, IZO, ZnO or $In_2O_3$, and when the pixel electrode is formed as a reflection electrode, the pixel electrode can be formed of ITO, IZO, ZnO or $In_2O_3$ on a reflection film after forming the reflection film using Ag, Mg, Al, Pt, Pd, Au, Ni, Nd, Ir, Cr, or a compound of these metals.

The facing electrode can be formed as a transparent electrode or a reflection electrode. When the facing electrode is formed as a transparent electrode, after depositing a metal having a low work function, such as Li, Ca, LiF/Ca, LiF/Al, Al, Ag, Mg, or a compound of these metals on the intermediate layer, an auxiliary electrode layer or a bus electrode line formed of a material for forming the transparent electrode, such as ITO, IZO, ZnO or $In_2O_3$, can be included on the material layer. When the facing electrode is formed as a reflection electrode, the facing electrode is formed by entirely depositing Li, Ca, LiF/Ca, LiF/Al, Al, Ag, Mg, or a compound of these metals. However, the present invention is not limited thereto and an organic material such as a conductive polymer can be used as the pixel electrode and the facing electrode.

The intermediate layer can be formed of an organic or inorganic material. If the intermediate layer is formed of an organic material, the organic material can be a low molecule organic material or a polymer organic material. If the intermediate layer is formed of a low molecule organic material, the intermediate layer can be formed in a single or a composite structure by stacking a Hole Injection Layer (HIL), a Hole Transport Layer (HTL), an Emission Layer (EML), an Electron Transport Layer (ETL), and an Electron Injection Layer (EIL). Organic materials that can be used for forming the intermediate layer includes copper phthalocyanine (CuPc), N,N'-Di(naphthalene-1-yl)-N,N'-diphenyl-benzidine (NPB), and tris-8-hydroxyquinoline aluminum (Alq3), and the present invention is not limited thereto. The low molecule organic layers can be formed by an evaporation method.

If the intermediate layer is formed of a polymer organic material, the intermediate layer can have a structure that includes an HTL and an EML. At this time, the polymer HTL can be formed of poly-(2,4)-ethylene-dihydroxy thiophene (PEDOT), and the light emitting layer can be formed of poly-phenylenevinylene (PPV) and Polyfluorene group polymers using a screen printing or an inkjet printing method.

However, the intermediate layer is not limited to the above, and can be formed of other materials and in other structures.

In the aforementioned electroluminescent display device, the leakage current and crosstalk can be prevented by including the TFTs according to the embodiments of the present invention. Accordingly, an electroluminescent display that displays a correct image according to inputted image signals can be manufactured.

Also, the present invention can be applied to any display that includes a TFT. The TFT according to the present invention can be mounted on each sub-pixel, and on a driving circuit that does not display an image.

A TFT according to the present invention, and a flat panel display including the TFT have the following advantages.

First, a patterning effect, since a TFT is separated from an adjacent TFT by a groove simply formed using a laser beam, can be obtained.

Second, the damage of an organic semiconductor layer can be avoided since an etching process including wet etching is not performed.

Third, the etching of the entire semiconductor layer except for a portion of the semiconductor layer that connects the source and drain electrodes is unnecessary since crosstalk can be avoided by forming the grooves, thereby reducing a process time and increasing process efficiency.

Fourth, a leakage current can be prevented by forming the width of the groove formed in a region of the semiconductor layer corresponding to the source and drain electrodes greater than the width of the source and drain electrodes.

Fifth, a leakage current that can be generated along a gate wire and a crosstalk that can occur between adjacent TFTs can be prevented by forming a groove in a region of the semiconductor layer corresponding to the gate wire and forming the width of the groove greater than the width of the gate wire.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A Thin Film Transistor (TFT), comprising:
   a substrate;
   a gate electrode arranged on the substrate;
   a source electrode and a drain electrode separated from each other and insulated from the gate electrode; and
   a semiconductor layer insulated from the gate electrode, contacts each of the source and drain electrodes, and includes grooves that separate at least a region of the semiconductor layer between the source and drain electrodes from an adjacent TFT;
   wherein each groove passes at least a portion of the semiconductor layer corresponding to the source and drain electrodes, and covers the source and drain electrodes except for a portion of the source electrode that faces the drain electrode and a portion of the drain electrode that faces the source electrode, wherein a portion of the semiconductor layer is arranged in an area that does not correspond to the source and drain electrodes, said portion of the semiconductor layer also not being arranged between the source and drain electrodes.

2. The TFT of claim 1, wherein a source wire is electrically connected to the source electrode, each groove passes at least a portion of the semiconductor layer corresponding to the source wire, and being projected onto the source wire covers the source wire.

3. The TFT of claim 1, wherein a drain wire is electrically connected to the drain electrode, each groove passes at least a portion of the semiconductor layer corresponding to the drain wire.

4. The TFT of claim 1, wherein each groove comprises a closed curve.

5. The TFT of claim 1, wherein each groove comprises at least a pair of parallel lines.

6. The TFT of claim 1, wherein a depth of each groove is less than a thickness of the semiconductor layer.

7. The TFT of claim 1, wherein a depth of each groove is greater than a thickness of the semiconductor layer, and is less than a thickness of at least a layer arranged under the semiconductor layer.

8. The TFT of claim 1, further comprising an insulating film adapted to insulate the semiconductor layer, the source electrode, and the drain electrode from the gate electrode.

9. The TFT of claim 1, wherein the semiconductor layer comprises an organic semiconductor layer.

10. A Thin Film Transistor (TFT), comprising:
a substrate;
a gate electrode arranged on the substrate and a gate wire electrically connected to the gate electrode;
a source electrode and a drain electrode separated from each other and insulated from the gate electrode; and
a semiconductor layer, insulated from the gate electrode, contacts each of the source and drain electrodes, and has grooves that separate at least a region of the semiconductor layer between the source and drain electrodes from an adjacent TFT;
wherein each groove passes at least a portion of the semiconductor layer corresponding to the gate wire, and a width of a portion of each groove is greater than a width of the gate wire, wherein a portion of the semiconductor layer is arranged in an area that does not correspond to the source and drain electrodes, said portion of the semiconductor layer also not being arranged between the source and drain electrodes.

11. The TFT of claim 10, wherein the groove passes a portion of the semiconductor layer corresponding to the gate wire and covers the gate wire.

12. The TFT of claim 10, wherein each groove comprises a closed curve.

13. The TFT of claim 10, wherein each groove comprises at least a pair of parallel lines.

14. The TFT of claim 10, wherein a depth of each groove is less than a thickness of the semiconductor layer.

15. The TFT of claim 10, wherein a depth of each groove is greater than a thickness of the semiconductor layer, and is less than a thickness of at least a layer arranged under the semiconductor layer.

16. The TFT of claim 10, further comprising an insulating film adapted to insulate the semiconductor layer, the source electrode, and the drain electrode from the gate electrode.

17. The TFT of claim 10, wherein the semiconductor layer comprises an organic semiconductor layer.

18. A Thin Film Transistor (TFT), comprising:
a substrate;
a gate electrode arranged on the substrate;
a source electrode and a drain electrode separated from each other and insulated from the gate electrode; and
a semiconductor layer, insulated from the gate electrode, contacts each of the source and drain electrodes, and has grooves that separate at least a region of the semiconductor layer between the source and drain electrodes from an adjacent TFT;
wherein a width of each groove is greater than a width of a wire arranged either on or under the semiconductor layer, wherein a portion of the semiconductor layer is arranged in an area that does not correspond to the source and drain electrodes, said portion of the semiconductor layer also not being arranged between the source and drain electrodes.

19. A flat panel display including a Thin Film Transistor (TFT), comprising:
a substrate;
a gate electrode arranged on the substrate;
a source electrode and a drain electrode separated from each other and insulated from the gate electrode; and
a semiconductor layer, insulated from the gate electrode, contacts each of the source and drain electrodes, and includes grooves that separate at least a region of the semiconductor layer between the source and drain electrodes from an adjacent TFT;
wherein each groove passes at least a portion of the semiconductor layer corresponding to the source and drain electrodes, and each groove that passes at least a portion of the semiconductor layer corresponding to the source and drain electrodes covers the source and drain electrodes except for a portion of the source electrode that faces the drain electrode and a portion of the drain electrode that faces the source electrode, wherein a portion of the semiconductor layer is arranged in an area that does not correspond to the source and drain electrodes, said portion of the semiconductor layer also not being arranged between the source and drain electrodes.

20. A flat panel display including a Thin Film Transistor (TFT), comprising:
a substrate;
a gate electrode arranged on the substrate and a gate wire electrically connected to the gate electrode;
a source electrode and a drain electrode separated from each other and insulated from the gate electrode; and
a semiconductor layer, insulated from the gate electrode, contacts each of the source and drain electrodes, and has grooves that separate at least a region of the semiconductor layer between the source and drain electrodes from an adjacent TFT;
wherein each groove passes at least a portion of the semiconductor layer corresponding to the gate wire, and a width of a portion of each groove is greater than a width of the gate wire, wherein a portion of the semiconductor layer is arranged in an area that does not correspond to the source and drain electrodes, said portion of the semiconductor layer also not being arranged between the source and drain electrodes.

* * * * *